US 6,717,144 B2

(12) United States Patent
Kimura et al.

(10) Patent No.: US 6,717,144 B2
(45) Date of Patent: Apr. 6, 2004

(54) SCANNING ELECTRON MICROSCOPE SYSTEM

(75) Inventors: Kouji Kimura, Tokyo-to (JP); Hirotami Koike, Tokyo-to (JP)

(73) Assignee: Kabushiki Kaisha TOPCON, Tokyo-to (JP)

( * ) Notice: Subject to any disclaimer, the term of this patent is extended or adjusted under 35 U.S.C. 154(b) by 0 days.

(21) Appl. No.: 10/306,596

(22) Filed: Nov. 27, 2002

(65) Prior Publication Data

US 2003/0102430 A1 Jun. 5, 2003

(30) Foreign Application Priority Data

Dec. 4, 2001 (JP) .......................... 2001-369707

(51) Int. Cl.[7] .................. G01N 23/00; G01B 11/00
(52) U.S. Cl. .................. 250/310; 250/311; 250/306; 250/307; 356/401
(58) Field of Search .................. 250/306, 307, 250/310, 311; 356/401

(56) References Cited

U.S. PATENT DOCUMENTS

| 5,412,210 | A | * | 5/1995 | Todokoro et al. | 250/310 |
| 5,510,617 | A | | 4/1996 | Troost et al. | 250/310 |
| 6,218,664 | B1 | | 4/2001 | Krans et al. | 250/310 |
| 6,252,412 | B1 | * | 6/2001 | Talbot et al. | 324/750 |
| 6,380,546 | B1 | * | 4/2002 | Petrov et al. | 250/396 R |
| 6,444,981 | B1 | * | 9/2002 | Todokoro et al. | 250/310 |
| 6,614,022 | B2 | * | 9/2003 | Hiroi et al. | 250/310 |
| 6,636,311 | B1 | * | 10/2003 | Ina et al. | 356/401 |

FOREIGN PATENT DOCUMENTS

| JP | 8-510596 | 11/1996 |
| JP | 8-329870 | 12/1996 |
| JP | 9-055181 | 2/1997 |
| JP | 11-067130 | 3/1999 |
| JP | 11-086770 | 3/1999 |
| JP | 2000-156192 | 6/2000 |
| JP | 2000-268755 | 9/2000 |
| JP | 2001-513258 | 8/2001 |
| WO | 95/26041 | 9/1995 |

* cited by examiner

Primary Examiner—John R. Lee
Assistant Examiner—Mary El-Shammaa
(74) Attorney, Agent, or Firm—Nields & Lemack

(57) ABSTRACT

A scanning electron microscope system with an electrostatic magnetic field complex objective lens, comprising at least two or more deflection means for tilting a primary electron beam and for projecting the primary electron beam onto a specimen, wherein one of the deflection means is arranged near the objective lens so as to generate a deflection field and also to serve as a compensation field for compensating abaxial aberration at the same time, and abaxial aberration of the primary electron beam deflected by the deflection means is compensated.

5 Claims, 3 Drawing Sheets

SCANNING ELECTRON MICROSCOPE SYSTEM

BACKGROUND OF THE INVENTION

The present invention relates to a scanning electron microscope system for measuring surface configuration and other data at high resolution by projecting an electron beam to scan a specimen, by detecting reflected electrons and secondary electrons generated from the specimen and by displaying a scanned image of the specimen based on a detection signal on an image display unit such as a cathode ray tube.

In the past, in a process to manufacture a semiconductor, a scanning electron microscope (SEM) has been used for performing observation and examination of configurations on a circuit pattern or a contact hole prepared on a wafer. In recent years, integration in a semiconductor device have become higher, a circuit pattern to be transferred or size of a contact hole have become increasingly finer, and there are now strong demands on the development of a scanning electron microscope system with high resolution for observing and examining these configurations and patterns. Contact holes with larger aspect ratio or deep graded steps are now formed more frequently on wafers as circuit patterns have become finer, and there are now more requests for measuring these configurations and patterns, not 2-dimensionally but 3-dimensionally.

In general, to perform 3 dimensional measurement, a primary electron beam is projected with tilting onto the specimen and a plurality of tilted observation images are synthesized and measurement is made. For this purpose, there may be a method to tilt a specimen stage or a method to project the primary electron beam with tilted angle onto the specimen without tilting the specimen. In a conventional type scanning electron microscope, when the primary electron beam is tilted, the primary electron beam passes through outside an axis of an objective lens, and abaxial aberration occurs. As a result, resolution is decreased. For this reason, it has been practiced in the past to perform observation on a tilted image by tilting the specimen stage.

In contrast, the present inventors have invented an electron beam optical system for performing observation on a tilted image without tilting the specimen stage. This system is disclosed in JP-A-11-67130.

Referring to FIG. 4, description will be given below on an electron beam optical system disclosed in JP-A-11-67130. FIG. 4 is an essential portion of an electronic optical system 1 of the electron beam optical system, and it is shown by an equivalent optical system.

In FIG. 4, reference numeral 2 denotes an optical axis of an electron beam optical system, 3 is a deflected orbit of a primary electron beam, and 4 is a specimen.

On the optical axis 2, there are arranged a deflector 5 (coil or electrostatic deflector), an objective lens 7, and a compensation deflection coil 8 to be superimposed on a lens magnetic field of the objective lens 7. In order to compensate abaxial aberration of the objective lens 7, which serves as a magnetic field type lens, the compensation deflection coil 8 is provided. A decelerating voltage is applied on the specimen 4, and a decelerating electrostatic lens 12 is formed by the deceleration field. To compensate abaxial aberration of the decelerating electrostatic lens 12, a compensation deflection electrode 9 is provided. By superimposing the magnetic field type objective lens 7 (compensated by the compensation deflection coil 8) on the decelerating electrostatic lens 12 (compensated by the compensation deflection electrode 9), an electrostatic magnetic field complex objective lens (superimposed lens) 13 is formed.

In the electron beam optical system as shown in FIG. 4, the primary electron beam is deflected by the deflector 5 and the electrostatic magnetic field complex objective lens 13 is electrically shifted and tilted so that deflection aberration can be removed.

A compensation deflection electromagnetic field is given by the compensation deflection coil 8 and the compensation deflection electrode 9 so that the deflected orbit 3 concurs with the optical axis of the objective lens 7, and the objective lens 7 is tilted at the same angle as the deflection angle and is shifted. That is, the compensation deflection coil 8 and the compensation deflection electrode 9 are arranged in the electronic optical system 1 as a means for achieving "compensation field" to electrically shift and tilt the electrostatic magnetic field complex objective lens 13 to remove deflection aberration of the deflected primary electron beam for the purpose of performing the observation on a tilted image.

In the electron beam optical system shown in FIG. 5, a second deflector 6 is arranged so that a tilting direction of the primary electron beam with respect to the specimen 4 can be changed.

As described in JP-A-11-67130, the compensation field for compensating abaxial aberration of the tilted primary electron beam can be given by the following expression:

$$(1/2) rB' + r'B + (1/2) r\phi'' + r'\phi' \qquad (1)$$

where B denotes axial magnetic field distribution of the electrostatic magnetic field complex objective lens 13, $\phi$ is an axial electrostatic potential of the electrostatic magnetic field complex objective lens 13, and r is a distance from the optical axis 2 to the orbit of the primary electron beam.

To tilt the primary electron beam and to compensate abaxial aberration, the compensation field to provide axial magnetic field distribution as given in the expression (1) must be superimposed on a converging field of the objective lens. In fact, however, it is difficult to manufacture the deflector, etc. to achieve such complicated axial magnetic field distribution.

SUMMARY OF THE INVENTION

It is an object of the present invention to provide a scanning electron microscope system, by which it is possible to compensate abaxial aberration of a tilted primary electron beam without requiring deflectors to make up a complicated compensation field, and it is possible to perform observation on a tilted image with relatively simple structure.

To attain the above object, the present invention provides a scanning electron microscope system with an electrostatic magnetic field complex objective lens, comprising at least two or more deflection means for tilting a primary electron beam and for projecting the primary electron beam onto a specimen, wherein one of the deflection means is arranged near the objective lens so as to generate a deflection field and also to serve as a compensation field for compensating abaxial aberration at the same time, and abaxial aberration of the primary electron beam deflected by the deflection means is compensated. Also, the present invention provides the scanning electron microscope system as described above, wherein either an electrostatic deflector or a magnetic field deflection coil is used as the deflection means for tilting the primary electron beam. Further, the present invention provides the scanning electron microscope system as described above, wherein the system comprises a specimen stage where the specimen is placed and a stage moving mechanism for moving the specimen stage, wherein the primary electron beam is tilted by the deflection means and simultaneously the specimen stage is moved to correspond to an amount of the deflection, and the same point on the specimen can be always observed even when a tilt angle of the primary electron beam is different. Also, the present invention provides the scanning electron microscope system as described above, wherein the system further comprises an arithmetic unit, two or more specimen images by the primary electron beam projected at different tilt angles onto the specimen are acquired, and a 3-dimensional specimen image is obtained by arithmetic processing of the plurality of specimen images by the arithmetic unit. Further, the present invention provides the scanning electron microscope system as described above, wherein the arithmetic unit measures configurations including a distance between two points on the specimen and depth from the single 3-dimensional specimen image obtained by the synthetic procedure.

DETAILED DESCRIPTION OF THE PREFERRED EMBODIMENT

Figure 1:
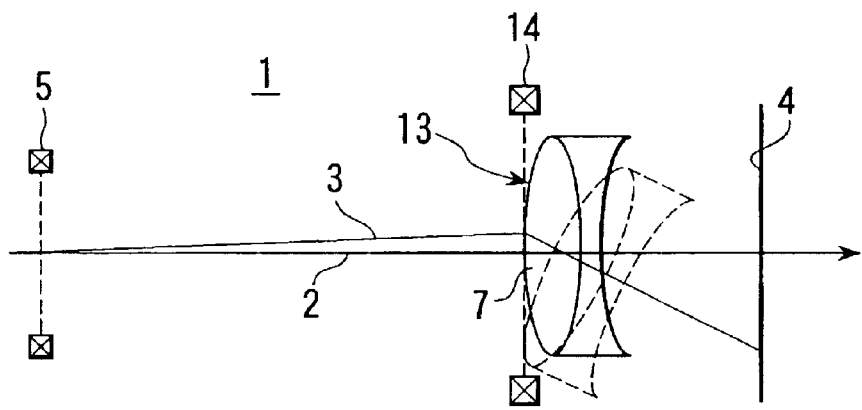
FIG. 1 is a drawing of essential portion to show an electron optical system of a scanning electron microscope system according to an embodiment of the present invention.

Description will be given below on an embodiment of the present invention referring to the drawings.

First, the basic principle of the present invention will be described.

As described above, in order to compensate abaxial aberration by tilting a primary electron beam, a compensation field to give such axial magnetic field distribution is given by:

$$(1/2)\, rB'' + r'B + (1/2)\, r\phi'' + r'\phi' \quad (1)$$

If this expression of axial electromagnetic field distribution of the compensation field is divided to two terms, i.e. to:

$$(1/2)\, rB' + (1/2)\, r\phi'' \quad (2)$$

and $$r'B + r'\phi' \quad (3),$$

the former is a compensation term to shift the electrostatic magnetic field complex objective lens, and the latter expresses the compensation field to tilt the electrostatic magnetic field complex objective lens.

The former contains differential of the axial electromagnetic field of the electrostatic magnetic field complex objective lens, and it is difficult to manufacture a deflector or the like to achieve such complicated axial magnetic field distribution. However, a compensation term to tilt the electrostatic magnetic field complex objective lens of the latter can be expressed by a multiple of a constant (=magnitude of tilting of orbit) of axial electromagnetic field of the electrostatic magnetic field complex objective lens. Thus, if the primary electron beam can be tilted extensively with the orbit of the tilted primary electron beam not separated very much from the optical axis, there is no need to compensate abaxial aberration to shift the electrostatic magnetic field complex objective lens as expressed by the term (2), and it will suffice to perform only the abaxial compensation to tilt the electrostatic magnetic field complex object lens as given by the term (3).

In this respect, the present invention is composed in such manner that at least two or more deflectors are provided, and one of the deflectors is arranged near the electrostatic magnetic field complex objective lens. By the first deflector, the orbit of the primary electron beam is deflected without being extensively separated from the optical axis, and the primary electron beam is extensively tilted in an opposite direction by a deflector arranged near the electrostatic magnetic field complex objective lens.

As already described, the deflected orbit of the tilted primary electron beam is not separated greatly from the optical axis until it enters the converging field of the electrostatic magnetic field complex objective lens in this case, and there is no need to consider compensation of abaxial aberration such as shifting of the electrostatic magnetic field complex objective lens. When the primary electron beam enters the converging field of the electrostatic magnetic field complex objective lens, the orbit is extensively tilted by the deflector arranged near the electrostatic magnetic field complex objective lens. In this case, by adjusting the intensity of the deflector arranged near the electrostatic magnetic field complex objective lens, the compensation field approximately expressed by the term (3) can be achieved. Thus, it is possible to tilt the primary electron beam and to have an electronic optical system for compensating abaxial aberration at the same time without using the deflectors or the like for compensation.

Next, description will be given on an embodiment of the present invention referring to FIG. 1.

Figure 4:
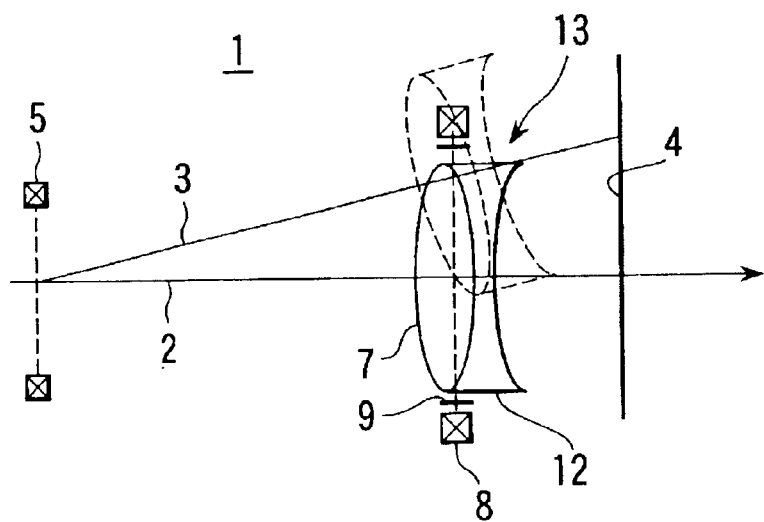
FIG. 4 is a drawing to explain a conventional system.
Figure 5:
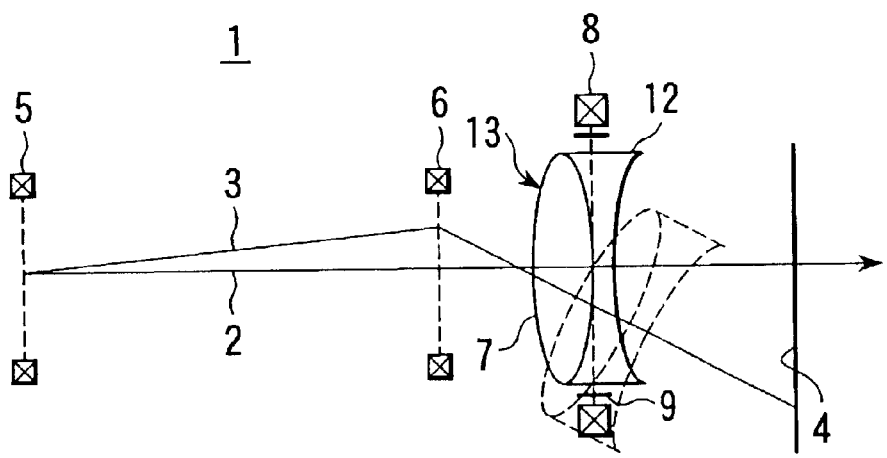
FIG. 5 is a drawing to explain another conventional system.

In FIG. 1, the same component as shown in FIG. 4 is referred by the same symbol.

On the optical axis 2, there are provided a first electrostatic deflector 5 (a magnetic field coil or an electrostatic deflector), an electrostatic magnetic field complex objective lens 13, and a second electrostatic deflector 14, serving as a deflector and a compensation deflector and arranged near the electrostatic magnetic field complex objective lens 13.

A primary electron beam 3 emitted from an electron gun (not shown) is deflected with respect to the optical axis 2 by the first electrostatic deflector 5. By the second electrostatic deflector 14, the primary electron beam 3 is deflected to a direction opposite to the direction deflected by the first electrostatic deflector 5. With the increase of a distance of deviation of the deflected orbit of the primary electron beam 3 from the optical axis 2, abaxial aberration is increased. If the intensity of the first electrostatic deflector 5 is sufficiently low, a tilt angle of the primary electron beam 3 can be decreased. As a result, it is possible to reduce the generated abaxial aberration even in an effective range of the converging field of the electrostatic magnetic field complex objective lens 13.

When the primary electron beam 3 enters the effective range of the converging field of the electrostatic magnetic field complex objective lens 13, its orbit is extensively tilted by the second electrostatic deflector 14. As already described, the second electrostatic deflector 14 arranged near the electrostatic magnetic field complex objective lens 13 tilts the orbit of the primary electron beam 3 and it is also effective for compensation of abaxial aberration to tilt the electrostatic magnetic field complex objective lens 13. As a result, it is possible to obtain an effect to tilt the electrostatic magnetic field complex objective lens 13 in association with the tilting of the deflected orbit of the primary electron beam 3.

Naturally, even when the orbit is extensively tilted by the first electrostatic deflector 5, the deflected orbit of the primary electron beam 3 is shifted away from the optical axis 2. Because the distance from the electrostatic magnetic field complex objective lens 13 to the surface of the specimen 4 is short, the deviation of the orbit of the primary electron beam 3 from the optical axis 2 is not increased very much even when the tilt angle of the primary electron beam 3 is large. As a result, there is no need to compensate the aberration such as shifting the electrostatic magnetic field complex objective lens 13.

Figure 2:
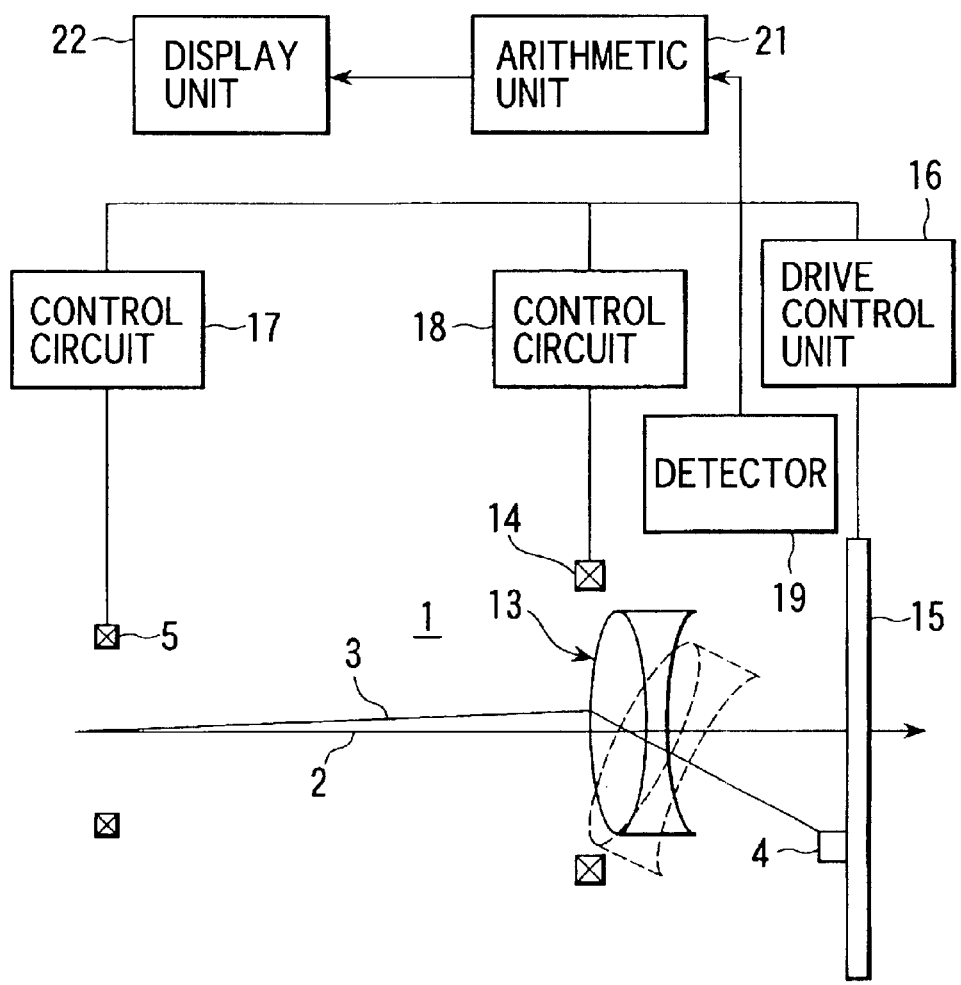
FIG. 2 is a block diagram of essential portion showing an embodiment of the present invention.
Figure 3:
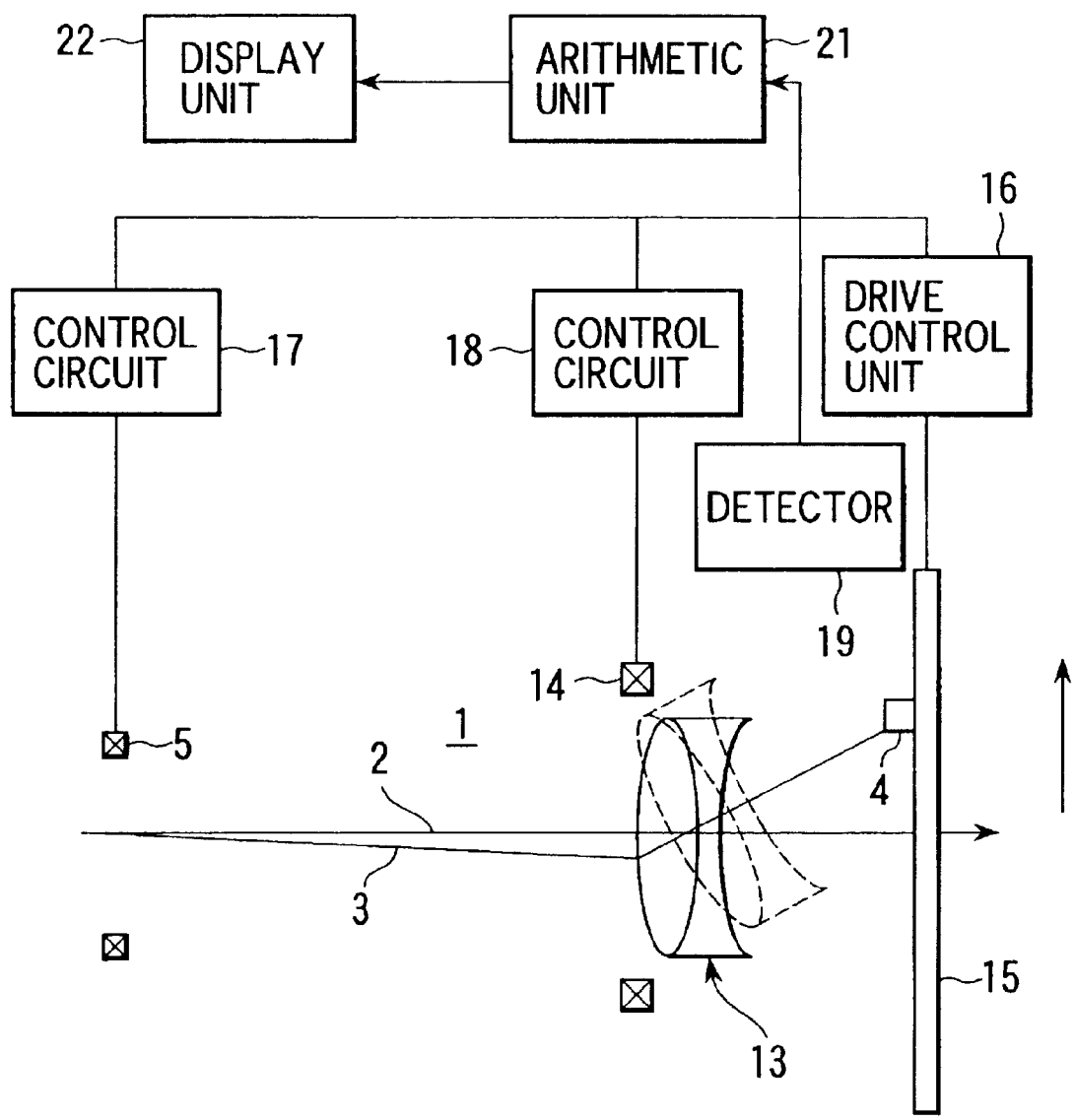
FIG. 3 is a block diagram to explain operation of the embodiment of the present invention.

Next, description will be given on a scanning electron microscope system for performing 3-dimensional observation referring to FIG. 2 and FIG. 3. In the figures, the same component as shown in FIG. 1 is referred by the same symbol, and detailed description is not given here.

There is provided a specimen stage 15, which is movable in two axial directions within a plane running perpendicularly with respect to the optical axis 2, and a specimen 4 is placed on the specimen stage 15. A drive control unit 16 is connected to the specimen stage 15. The drive control unit 16 is provided with a driving mechanism (not shown) for driving the specimen stage 15 in two axial directions and with a control unit (not shown) for controlling the driving mechanism. The specimen stage 15 is moved by the drive control unit 16, and its position is controlled.

Control circuits 17 and 18 are connected to the first electrostatic deflector 5 and the second electrostatic deflector 14 respectively. The power applied on the first electrostatic deflector 5 and the second electrostatic deflector 14 is controlled by the control circuits 17 and 18, and an amount of deflection, etc. of the primary electron beam 3 is controlled.

The primary electron beam 3 is projected to the specimen 4, and the generated reflected electrons and secondary electrons are detected by a detector 19. The result of the detection is inputted to an arithmetic unit 21, and the arithmetic unit 21 calculates a specimen image based on a signal from the detector 19. A plurality of specimen images in different directions are processed by image processing, and a 3-dimensional image is calculated. Then, image data are sent to a display unit 22 and a 3-dimensional image is displayed.

Description will be given below on operation.

As described above, the primary electron beam 3 with tilting can be projected to the specimen 4 and a specimen image of the specimen 4 can be obtained.

Also, it is necessary to have specimen images in different directions at the same point of the specimen 4 in order to attain 3-dimensional observation, and a tilt angle and a deflecting direction of the primary electron beam 3 and an incident position of the primary electron beam 3 on the specimen 4 must be measured in advance. The specimen stage 15 is moved by the drive control unit 16 to correspond to the direction of observation and the tilt angle so that observation can be made certainly at the same point on the specimen 4 when the primary electron beam 3 is tilted at the same angle in different directions. By moving the specimen stage 15, the primary electron beam 3 can be projected to the same position on the specimen 4 even when the tilt angle and the direction of the primary electron beam 3 are changed, and images of the specimen 4 seen at the same point and from different directions can be obtained.

The arithmetic unit 21 reconstructs these images and obtains a 3-dimensional specimen image. The 3-dimensional specimen image is displayed on the display unit 22 or stored in an external storage device (not shown) such as a hard disk. Based on the 3-dimensional specimen image obtained by calculation, the arithmetic unit 21 calculates and measures a distance between two points, depth, etc. on the specimen 4.

In the description given above, for convenience's sake, the number of the deflectors was limited to two and the deflectors were described as electrostatic deflectors, while the deflector used in the invention is not limited to the electrostatic deflector. The same electronic optical system can be composed by using a magnetic field deflection coil. Also, the same electronic optical system can be composed by arranging at least one or more electrostatic deflectors or magnetic field deflection coils near the electrostatic magnetic field complex objective lens 13 and by adjusting an intensity ratio of an arbitrary number of electrostatic deflectors or magnetic field deflection coils arranged on the optical axis 2. Therefore, there is no restriction on number and type of the deflectors used in the electronic optical system of the present invention.

As described above, for the purpose of performing observation on a tilted image without tilting the specimen stage, it has been necessary in the past to arrange a deflector for providing a complicated compensation field near the electrostatic magnetic field complex objective lens 13. According to the present invention, it is possible to compensate abaxial aberration of the tilted primary electron beam requiring no such complicated compensation field. With relatively simple structure, a scanning electron microscope system capable of observation on a tilted image can be provided.

Further, the observation on a tilted image can be carried out within short time because the specimen stage is not tilted. In the process to manufacture semiconductor products, it is possible to perform 3-dimensional measurement without reducing the throughput. Because a control mechanism is also provided, which can move the specimen stage to correspond to the tilt angle and the direction of the primary electron beam, it is possible to obtain specimen images from different directions without shifting a visual field. Based on these specimen images, a 3-dimensional specimen image can be constructed, and measurement can be performed.

A scanning electron microscope system with an electrostatic magnetic field complex objective lens according to the present invention comprises at least two or more deflection means for tilting a primary electron beam and for projecting the primary electron beam onto a specimen, one of the deflection means is arranged near the objective lens so as to generate a deflection field and to serve as a compensation field for compensating abaxial aberration at the same time. Thus, abaxial aberration of the primary electron beam deflected by the deflection means is compensated. Abaxial aberration of the tilted electron beam can be compensated without requiring a complicated compensation field. As a result, the observation on a tilted image can be carried out by a system with relatively simple structure.

Further, there is no need to tilt the specimen stage, and observation on a tilted image can be performed within short time. When this is used in the process to manufacture semiconductor products, it is possible to achieve 3-dimensional measurement, etc. without decreasing production throughput.

The scanning electron microscope system comprises a specimen stage where a specimen is placed, and the stage moving mechanism for moving the specimen stage, and a primary electron beam is tilted by the deflection means and simultaneously the specimen stage is moved to correspond to an amount of the deflection, and the same point of the specimen can be always observed even when a tilted angle of the primary electron beam is different. As a result, it is possible to obtain specimen images in different directions without moving a visual field, and it is possible to achieve measurement, etc. by constructing a 3-dimensional specimen these specimen images.

What is claimed is:

1. A scanning electron microscope system with an electrostatic magnetic field complex objective lens, comprising at least two or more deflection means for tilting a primary electron beam and for projecting said primary electron beam onto a specimen, wherein a first deflecting means of said deflection means tilts the primary electron beam and a second deflecting means of said deflection means is arranged near said objective lens so as to generate a deflection field and also to serve as a compensation field for compensating abaxial aberration at the same time, and abaxial aberration of the primary electron beam deflected by said first deflecting deflection means is compensated, wherein said first deflecting means deflects the abaxial aberration of said primary electron beam within a range in which $(1/2)\, rB' + (1/2)\, r\phi''$ is negligible, and said deflection field is $r'B + r'\phi'$, where B denotes axial magnetic field distribution of the electrostatic magnetic field complex objective lens, $\phi$ is an axial electrostatic potential of said electrostatic magnetic complex objective lens, and r is a distance from an optical axis to an orbit of the primary electron beam.

2. A scanning electron microscope system according to claim 1, wherein either an electrostatic deflector or a magnetic field deflection coil is used as said deflection means for tilting the primary electron beam.

3. A scanning electron microscope system according to claim 1, wherein said system comprises a specimen stage where the specimen is placed and a stage moving mechanism for moving said specimen stage, wherein the primary electron beam is tilted by said deflection means and simultaneously said specimen stage is moved to correspond to an amount of the deflection, and the same point on the specimen can be always observed even when a tilt angle of the primary electron beam is different.

4. A scanning electron microscope system according to claim 1, wherein said system further comprises an arithmetic unit, two or more specimen images by the primary electron beam projected at different tilt angles onto the specimen are acquired, and a 3-dimensional specimen image is obtained by arithmetic processing of the plurality of specimen images by said arithmetic unit.

5. A scanning electron microscope system according to claim 4, wherein said arithmetic unit measures configurations including a distance between two points on the specimen and depth from said single 3-dimensional specimen image obtained by the synthetic procedure.

* * * * *